United States Patent
Wong

[11] Patent Number: 6,017,803
[45] Date of Patent: Jan. 25, 2000

[54] METHOD TO PREVENT DISHING IN CHEMICAL MECHANICAL POLISHING

[75] Inventor: Harianto Wong, Singapore, Singapore

[73] Assignee: Chartered Semiconductor Manufacturing, Ltd., Singapore, Singapore

[21] Appl. No.: 09/104,034

[22] Filed: Jun. 24, 1998

[51] Int. Cl.[7] .................................................. H01L 21/76
[52] U.S. Cl. .......................... 438/430; 438/437; 438/435; 438/692; 438/424
[58] Field of Search .................... 438/424, 427, 438/430, 435, 437, 692

[56] References Cited

U.S. PATENT DOCUMENTS

| | | | |
|---|---|---|---|
| 4,957,881 | 9/1990 | Crotti | 437/195 |
| 4,962,064 | 10/1990 | Haskell et al. | 437/228 |
| 5,362,669 | 11/1994 | Boyd et al. | 437/67 |
| 5,380,546 | 1/1995 | Krishnan et al. | 427/126.1 |
| 5,451,551 | 9/1995 | Krishnan et al. | 437/241 |
| 5,721,172 | 2/1998 | Jang et al. | 438/424 |
| 5,804,490 | 9/1998 | Fiegl et al. | 438/424 |
| 5,872,043 | 2/1999 | Chen | 438/424 |

*Primary Examiner*—Trung Dang
*Attorney, Agent, or Firm*—George O. Saile; Rosemary L. S. Pike; Larry J. Prescott

[57] ABSTRACT

A method is described for filling trenches in a substrate for shallow trench isolation or for a metal damascene structure which will prevent dishing when the substrate is planarized using chemical mechanical polishing. Trenches are formed in the substrate. A layer of first material is formed on the substrate, sidewalls of the trench, and bottom of the trench. A layer of second material is then formed on the layer of first material. The substrate is then planarized using a chemical mechanical polishing. The first material, second material, and parameters of the chemical mechanical polishing are chosen so that the removal rate of the first material is greater than the removal rate of the second material. The chemical mechanical polishing then results in a planar substrate with no dishing.

17 Claims, 2 Drawing Sheets

METHOD TO PREVENT DISHING IN CHEMICAL MECHANICAL POLISHING

BACKGROUND OF THE INVENTION

1. Field of the Invention

This invention relates to using CMP, chemical mechanical polishing, to planarize substrates having trenches used for shallow trench isolation or for a metal damascene structure.

2. Description of the Related Art

U.S. Pat. No. 4,962,064 to Haskell et al. describes a method of planarizing a substrate having filled trenches formed therein. The trenches are filled with two materials such as a layer of an oxide followed by a layer of polysilicon. After filling the trenches a CMP step is followed by an etching step to produce a planar substrate.

U.S. Pat. No. 5,362,669 to Boyd et al. describes a method of planarizing a substrate having filled trenches formed therein. A first CMP resistant layer is formed on a substrate. The trenches are then formed in the substrate followed by the deposition of a layer of dielectric. A second layer of CMP resistant material is then deposited having the same thickness as the first CMP resistant layer. The substrate is then planarized using CMP.

U.S. Pat. No. 4,957,881 to Crotti describes methods of forming self aligned contacts. The methods comprise planarization of the substrate using etching methods.

U.S. Pat. No. 5,380,546 to Krishnan et al. and U.S. Pat. No. 5,451,551 to Krishnan et al. describe methods of planarizing a substrate for multilevel metallization processes. The methods comprise protecting a metal feature using barrier materials prior to planarization of the substrate.

A Patent Application (CS-97-043) entitled "A METHOD TO AVOID DISHING IN FORMING TRENCHES FOR SHALLOW TRENCH ISOLATION" Serial No., Filed, and assigned to the same Assignee describes a method of filling trenches with a dielectric which is formed at a greater rate within the trench than outside of the trench.

SUMMARY OF THE INVENTION

As dimensions in integrated circuit wafers decrease the use of shallow trench isolation between circuit segments and the use of metal damascene structures increases. Both of these processes require filling shallow trenches formed in the substrate followed by planarization usually using chemical mechanical polishing. This planarization step can often lead to dishing at the top of the trench and loss of planarity of the surface of the integrated circuit wafer.

It is a principle objective of this invention to provide a method of filling trenches which will prevent dishing at the top of the trench during the planarization step and provide good planarity for the wafer surface.

It is a principle objective of this invention to provide a method of filling shallow isolation trenches which will prevent dishing at the top of the trench during the planarization step and provide good planarity for the wafer surface.

It is another principle objective of this invention to provide a method of filling trenches with metal for a metal damascene structure which will prevent dishing at the top of the trench during the planarization step and provide good planarity for the wafer surface.

These objectives are achieved by forming a layer of a first material on a substrate in which a trench has been formed. The layer of first material is formed on the sidewalls and the bottom of the trench. A layer of a second material is then formed on the layer of first material. That part of the layer of first material and that part of the layer of second material above the plane of the top surface of the substrate are removed using a chemical mechanical polishing adjusted so that the removal rate of the first material is greater than the removal rate of the layer of second material. This avoids dishing and results in a planar surface.

DESCRIPTION OF THE PREFERRED EMBODIMENTS

Figure 1:
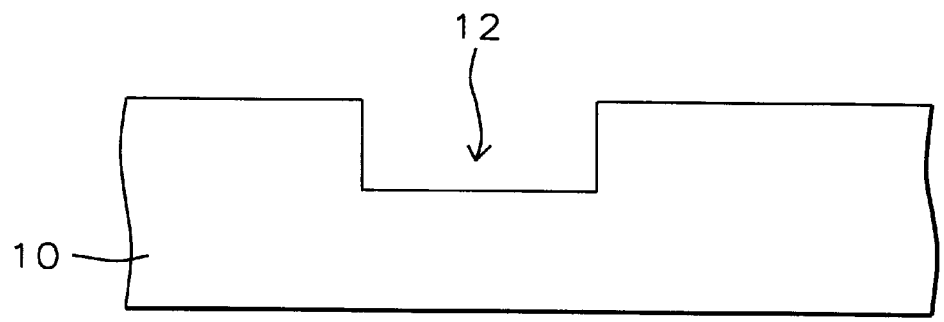
FIG. 1 shows a cross section view of a part of a substrate having a trench formed therein.
Figure 2:
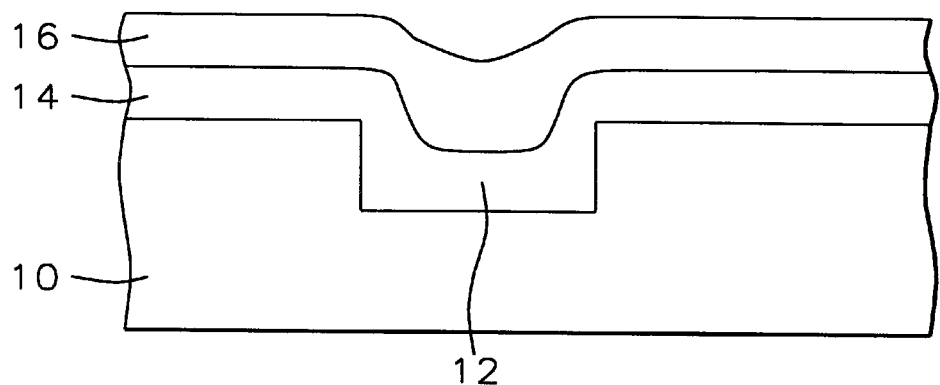
FIG. 2 shows a cross section view of the substrate of FIG. 1 after forming a layer of first dielectric on the top of the substrate, the sidewalls of the trench, and the bottom of the trench and a layer of second material on the layer of first dielectric.
Figure 3:
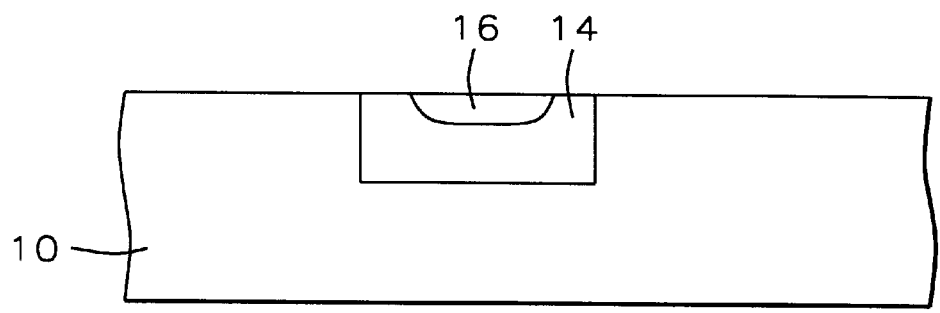
FIG. 3 shows a cross section view of the substrate of FIG. 1 after the substrate has been planarized.

Refer now to FIGS. 1–3 for a description of the method of filling isolation trenches of this invention. FIG. 1 shows a cross section view of a substrate 10 having a trench 12 formed therein. In this example the substrate 10 is a silicon integrated circuit wafer however it will be readily apparent to those skilled in the art that the substrate is not limited to a silicon integrated circuit wafer. The substrate may optionally have one or more dielectric layers formed thereon, not shown, such as a layer of pad oxide and a layer of silicon nitride. The trench 12 has a depth of between about 2000 and 7000 Angstroms and typically, but not necessarily, has a width of about 1 micrometer or greater. The trench is formed by methods well known to those skilled in the art and may require steps including the formation of a resist mask followed by dry anisotropic etching.

As shown in FIG. 2, a layer of first dielectric material 14 is then formed on the top surface of the substrate, the sidewalls of the trench, and the bottom of the trench using chemical vapor deposition. The layer of first dielectric material can be, for example, a layer of silicon oxide having a thickness of between about 1000 and 3000 Angstroms. Next a layer of second material 16 is formed on the layer of first dielectric material 14 using chemical vapor deposition. The layer of second material can be a layer of silicon nitride having a thickness of between about 2000 and 15,000 Angstroms or can be a layer of polysilicon having a thickness of between about 2000 and 15,000 Angstroms. The combined thickness of the layer of first dielectric material 14 and the layer of second material 16 must be greater than the depth of the trench 12.

That part of the layer of first dielectric material 14 and the layer of second material 16 above the plane of the top surface of the substrate is then removed using chemical mechanical polishing. The first dielectric material 14, the second material 16, and the parameters of the chemical mechanical polishing are chosen to provide a removal rate for the first dielectric material 14 which is at least 1.5 times as large as the removal rate of the second material 16. For the example of a first dielectric material of silicon oxide and a second material of silicon nitride or polysilicon this can be achieved using a polishing slurry having ammonia-based chemistry with a pH less than 9 and silica particles with a particle size of less then 160 nanometers.

As shown in FIG. 3, this difference of removal rates for the first dielectric material 14 and second material 16 prevents dishing and results in a planar surface leaving first dielectric material 14 and second material 16 only in the trench and removing any first dielectric material and second material above the plane of the top surface of the substrate. The substrate is left with a highly planar surface for subsequent processing steps.

Figure 4:
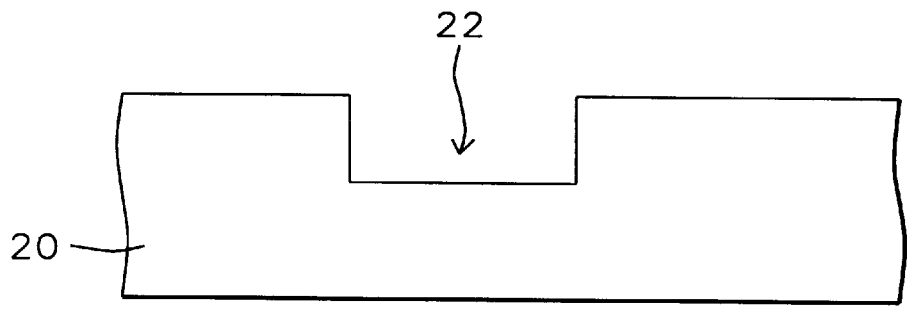
FIG. 4 shows a cross section view of a part of a substrate having a trench formed therein.
Figure 5:
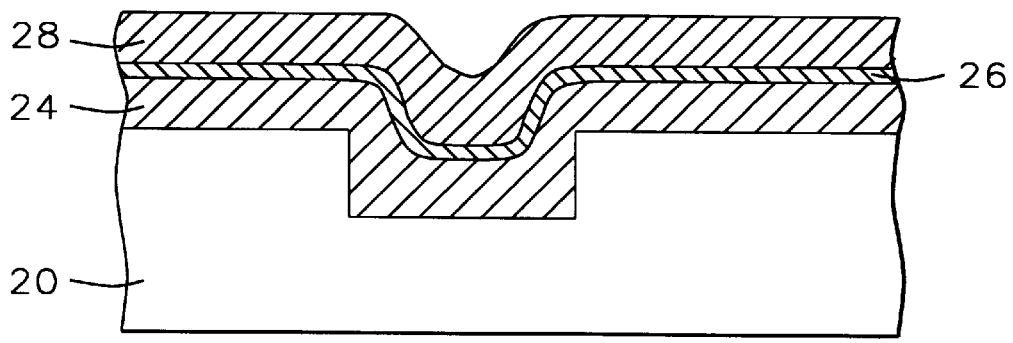
FIG. 5 shows a cross section view of the substrate of FIG. 4 after forming a layer of first metal on the top of the substrate, the sidewalls of the trench, and the bottom of the trench, a layer of second metal on the layer of first metal, and a layer of third metal on the layer of second metal.
Figure 6:
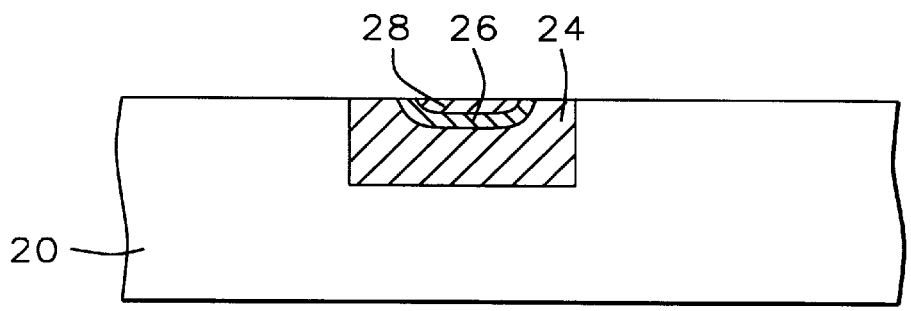
FIG. 6 shows a cross section view of the substrate of FIG. 4 after the substrate has been planarized.

Refer now to FIGS. 4–6 for a method of forming a metal damascene structure of this invention. FIG. 4 shows a cross section view of a substrate 20 having a trench 22 formed therein. Since a metal electrode is to be formed in the substrate the substrate is an insulating material such as silicon oxide or silicon nitride. In this example the substrate 20 is a dielectric material formed on a silicon integrated circuit wafer. The trench 22 has a depth of between about 2000 and 7000 Angstroms and typically, but not necessarily, has a width of about 1 micrometer or less. The trench is formed by methods well known by those skilled in the art and may require steps including the formation of a resist mask followed by dry anisotropic etching.

As shown in FIG. 5, a layer of first metal 24 is then formed on the top surface of the substrate, the sidewalls of the trench, and the bottom of the trench. The layer of first metal 24 is, for example, a layer of aluminum having a thickness of between about 2000 and 6000 Angstroms or a layer of copper having a thickness of between about 2000 and 6000 Angstroms. Next a layer of second metal 26 is formed on the layer of first metal 14. The layer of second metal 26 is a metal which will adhere well to the layer of first metal and can be a layer of titanium nitride having a thickness of between about 400 and 1500 Angstroms. A layer of third metal 28 is formed on the layer of second metal 26. The layer of third metal 28 in this example is a layer of tungsten having a thickness of between about 1000 and 8000 Angstroms. The very thin layer of second metal 26 adheres well to both the first metal and the third metal and holds the three layer metal structure together. The combined thickness of the layer of first metal 24, the layer of second metal 26, and the layer of third metal 28 must be greater than the depth of the trench 22.

That part of the layer of first metal 24, the layer of second metal 26, and the layer of third metal 28 above the plane of the top surface of the substrate is then removed using chemical mechanical polishing. The first metal 24, the third metal 28, and the parameters of the chemical mechanical polishing are chosen to provide a removal rate for the first metal 24 which is at least 1.5 times as large as the removal rate of the third metal 28 and a removal rate for the second metal 26 which is at least 1.5 times as large as the removal rate of the third metal 28. For the example of a first metal of aluminum or copper, a second metal of titanium nitride, and a third metal of tungsten this can be achieved using a polishing slurry having alkaline-based chemistry, such as $KIO_3$, peroxide-based chemistry, such as $H_2O_2$, or nitrate based chemistry with a pH less than 6 and alumina or silica particles with a particle size of less then 200 nanometers.

As shown in FIG. 6, this difference of removal rates for the first metal 24, second metal 26, and third metal 28 prevents dishing and results in a planar surface leaving first metal 24, second metal 26, and third metal 28 only in the trench and removing any first metal, second metal, and third metal above the plane of the top surface of the substrate. In this manner a conducting electrode is formed in the substrate and the substrate is left with a highly planar surface for subsequent processing steps.

While the invention has been particularly shown and described with reference to the preferred embodiments thereof, it will be understood by those skilled in the art that various changes in form and details may be made without departing from the spirit and scope of the invention.

What is claimed is:

1. A method of filling trenches, comprising the steps of:
   providing a substrate having a trench formed therein, wherein said substrate has a first surface and said trench has sidewalls and a bottom;
   forming a layer of a first metal on said first surface of said substrate, said sidewalls of said trench, and said bottom of said trench;
   forming a layer of a second material on said layer of said first metal; and
   removing that part of said layer of said first metal and that part of said layer of said second material above the plane of said first surface of said substrate using a chemical mechanical polishing, wherein said chemical mechanical polishing is adjusted so that the removal rate of said first metal is greater than the removal rate of said second material.

2. The method of claim 1 wherein said second material is a second metal.

3. The method of claim 1 wherein said first metal is aluminum.

4. The method of claim 1 wherein said first metal is copper.

5. The method of claim 1 wherein said second material is tungsten.

6. The method of claim 1 wherein said substrate is a layer of dielectric formed on a silicon integrated circuit wafer.

7. A method of filling trenches, comprising the steps of:
   providing a substrate having a trench formed therein, wherein said substrate has a first surface and said trench has sidewalls and a bottom;
   forming a layer of a first dielectric on said first surface of said substrate, said sidewalls of said trench, and said bottom of said trench;
   forming a layer of polysilicon on said layer of said first dielectric; and
   removing that part of said layer of said first dielectric and that part of said layer of said polysilicon above the plane of said first surface of said substrate using a chemical mechanical polishing, wherein said chemical mechanical polishing is adjusted so that the removal rate of said first dielectric is greater than the removal rate of said polysilicon.

8. The method of claim 7 wherein said layer of first dielectric is a layer of silicon oxide.

9. The method of claim 7 wherein said layer of polysilicon is formed using chemical vapor deposition.

10. The method of claim 7 wherein said substrate is a silicon integrated circuit wafer.

11. A method of filling trenches, comprising the steps of:
    providing a substrate having a trench formed therein, wherein said substrate has a first surface and said trench has sidewalls and a bottom;

forming a layer of a first metal on said first surface of said substrate, said sidewalls of said trench, and said bottom of said trench;

forming a layer of a second metal on said layer of said first metal;

forming a layer of a third metal on said layer of said second metal; and removing that part of said layer of said first metal, that part of said layer of said second metal, and that part of said layer of said third metal above the plane of said first surface of said substrate using a chemical mechanical polishing, wherein said chemical mechanical polishing is adjusted so that the removal rate of said first metal is greater than the removal rate of said third metal.

12. The method of claim 11 wherein said first metal is aluminum.

13. The method of claim 11 wherein said first metal is copper.

14. The method of claim 11 wherein said layer of said second metal acts as an adhesive between said layer of said first metal and said layer of said third metal.

15. The method of claim 11 wherein said second metal is titanium nitride.

16. The method of claim 11 wherein said third metal is tungsten.

17. The method of claim 11 wherein said substrate is a layer of dielectric material formed on a silicon integrated circuit wafer.

* * * * *